(12) United States Patent
Kawajiri et al.

(10) Patent No.: US 7,652,924 B2
(45) Date of Patent: *Jan. 26, 2010

(54) DATA PROCESSING CIRCUIT FOR CONTACTLESS IC CARD

(75) Inventors: Yoshiki Kawajiri, Musashino (JP); Masaaki Terasawa, Akishima (JP); Takanori Yamazoe, Hadano (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/171,724

(22) Filed: Jul. 11, 2008

(65) Prior Publication Data

US 2008/0279011 A1 Nov. 13, 2008

Related U.S. Application Data

(60) Continuation of application No. 11/819,288, filed on Jun. 26, 2007, now Pat. No. 7,411,831, which is a division of application No. 11/115,132, filed on Apr. 27, 2005, now Pat. No. 7,251,162.

(30) Foreign Application Priority Data

Apr. 27, 2004 (JP) .............................. 2004-130710

(51) Int. Cl.
*G11C 16/04* (2006.01)
(52) U.S. Cl. ........................... 365/185.18; 365/185.28; 365/185.29; 365/233.1
(58) Field of Classification Search ............ 365/185.18, 365/185.28, 185.29, 233.1
See application file for complete search history.

(56) References Cited

U.S. PATENT DOCUMENTS 5,159,543 A 10/1992 Yamawaki
5,881,012 A 3/1999 Kawasaki et al.
6,535,435 B2 3/2003 Tanaka et al.
6,560,145 B2 5/2003 Martines et al.
6,567,313 B2 5/2003 Tanaka et al.
6,650,172 B1 11/2003 Shingyouchi
6,791,884 B2 9/2004 Matsuda et al.
6,888,399 B2 5/2005 Nakagawa et al.
7,411,831 B2 * 8/2008 Kawajiri et al. ........ 365/185.18

FOREIGN PATENT DOCUMENTS

JP 04-222455 A 8/1992
JP 06-223588 A 8/1994

(Continued)

*Primary Examiner*—Hoai V Ho
(74) *Attorney, Agent, or Firm*—Miles & Stockbridge P.C.

(57) ABSTRACT

The present invention is directed to largely reduce peak current at the time of operation of a boosting circuit provided for an EEPROM. In the erase/write operation, first, a low-frequency clock signal as a selection clock signal is input by a low-frequency clock control signal to a charge pump. After lapse of a certain period (about ⅓ of fall time), a high-frequency clock signal having a frequency higher than that of the low-frequency clock signal is output by a high-frequency clock control signal and is input as the selection clock signal to the charge pump to boost a voltage to a predetermined voltage level. In such a manner, while suppressing the peak of consumption current, the fall time of the boosted voltage can be shortened.

6 Claims, 11 Drawing Sheets

FOREIGN PATENT DOCUMENTS

| | | |
|---|---|---|
| JP | 2001-025237 A | 1/2001 |
| JP | 2002-109894 | 4/2002 |
| JP | 2003-244940 A | 8/2003 |
| JP | 2004-005773 A | 1/2004 |
| WO | WO 02/19342 | 3/2002 |

* cited by examiner

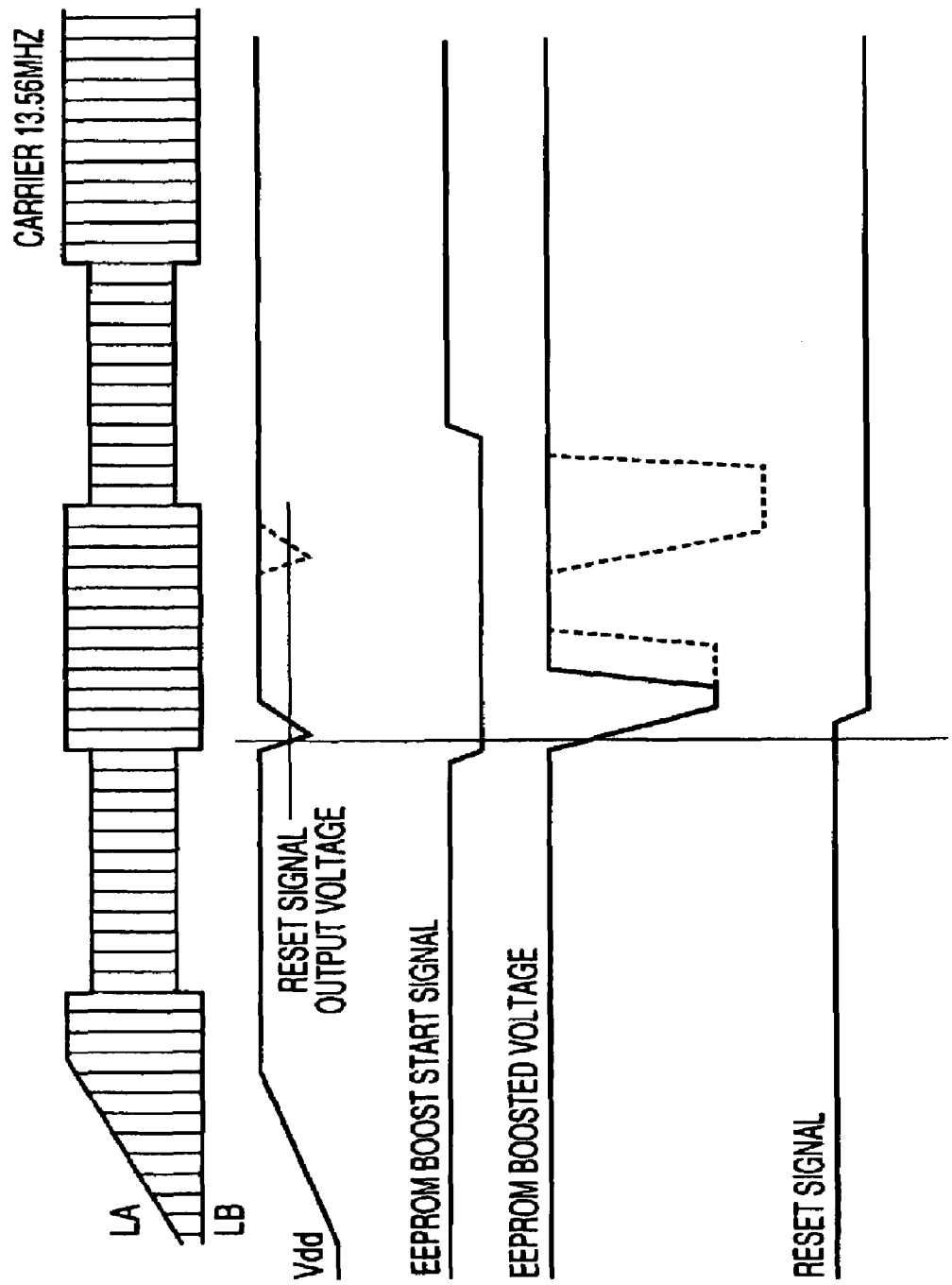

DATA PROCESSING CIRCUIT FOR CONTACTLESS IC CARD

CROSS-REFERENCE TO RELATED APPLICATION

This application is a continuation of application Ser. No. 11/819,288 filed Jun. 26, 2007 (now U.S. Pat. No. 7,411,831), which is a division of application Ser. No. 11/115,132 filed Apr. 27, 2005 (now U.S. Pat. No. 7,251,162). This application also claims priority from Japanese patent application No. 2004-130710 filed Apr. 27, 2004, the content of which is hereby incorporated by reference into this application.

BACKGROUND OF THE INVENTION

The present invention relates to a voltage boosting technique in a semiconductor memory and, more particularly, to a technique effective when applied to control of a boosted voltage in an EEPROM (Electrically Erasable and Programmable Read Only Memory).

In recent years, an IC card having the functions of a credit card and a telephone card is being spread. The IC card is a card having a shape similar to that of a magnetic card and on which a CPU and a memory are mounted. Reading/writing on the memory is controlled by the CPU. The card itself has a ciphering function and therefore has a high security function and large storage capacity.

There are IC cards of a contact type having, as one of means for transmitting/receiving information to/from an external device such as a reader/writer, mechanical coupling means to the external device, a non-contact type for transmitting information via an information transmitting medium such as waves, and a so-called dual way type of a contact/non-contact type.

An IC card of the non-contact type, in the vicinity of an external device, receives electric waves emitted from the external device. Current flows in a coil as an antenna provided in the IC card by electromagnetic induction, an alternating current voltage is applied to a semiconductor integrated circuit device to which both ends of the coil are connected, thereby supplying power.

The semiconductor integrated circuit device converts the supplied alternating current voltage to a direct current voltage by a rectifying circuit, generates an internal power source voltage Vdd via a regulator, and supplies it to modules.

In an IC card, an EEPROM is widely used as a memory. The EEPROM is an electrically erasable and programmable read only memory and stores data to be input/output to/from the IC card.

The EEPROM has a voltage boosting circuit constructed by a charge pump circuit and the like. The voltage boosting circuit generates a write voltage and an erase voltage used for data writing operation from the internal power source voltage supplied via the regulator.

Examples of the semiconductor memory of this type are a flash memory which performs a time division process to suppress peak current (refer to Japanese Unexamined Patent Publication No. 2002-109894) and an EEPROM in which voltage boosting speed is controlled to be constant irrespective of load capacity (refer to International Publication No. W02-19342).

SUMMARY OF THE INVENTION

The inventors herein, however, found that the IC cards have the following problems.

In an IC card of the non-contact type, electric waves emitted from an external device are received and power is supplied. Consequently, whether the semiconductor integrated circuit device in the IC card operates or not depends on the communication distance to the external device.

In this case, load drivability in the semiconductor integrated circuit device is inversely proportional to the square of the communication distance. As the communication distance increases, the load drivability deteriorates. For example, when the boosting circuit in the EEPROM operates in a state where the IC card operates near the lower limit of the load drivability, since the peak current on start of operation of the boosting circuit is large, a sudden voltage drop occurs in the internal power source voltage Vdd. It may cause erroneous operation in the IC card or the like.

To stably operate the IC card, the load drivability which is sufficiently high not to cause a sudden voltage drop even when the boosting circuit operates is necessary. As described above, the load drivability is inversely proportional to the square of the communication distance. Consequently, there is a problem such that, to obtain sufficient load drivability, the communication distance of the IC card is shortened.

FIG. 11 is an operation timing chart in the IC card examined by the inventors herein.

The diagram shows, from top to bottom, signal timings of electric waves supplied from an external device, internal operation voltage Vdd output from the regulator, a boost start signal supplied to the boosting circuit in the EEPROM, a boosted voltage generated by the boosting circuit, and a reset signal.

First, when electric waves are received from the external device, the internal power source voltage Vdd is output from the regulator. After that, a boost start signal is output from the control circuit in the EEPROM to the boosting circuit, and the boosting circuit generates an erase voltage (for example, about −8.5 V) used for the erasing operation. The boosting circuit is generally constructed by a charge pump circuit and the like.

At this time, in communication distance at which sufficiently high load drivability cannot be obtained, the peak current at the time of driving a pumping capacitor in the boosting circuit is large, so that the internal power source voltage Vdd drops.

When the internal power source voltage Vdd drops to the reset signal output voltage or lower, a reset signal is output to the semiconductor integrated circuit device and it may cause erroneous operation or the like.

An object of the invention is to provide a technique capable of performing stable communications with increased communication distance in an IC card by suppressing a peak current at the time of operation of a boosting circuit provided for an EEPROM.

The above and other objects and novel features of the invention will become apparent from the description of the specification and the appended drawings.

The outline of representative ones of the inventions disclosed in the application will be briefly described as follows.

A semiconductor integrated circuit device of the invention includes: a memory cell array having a plurality of nonvolatile memory cells; and a voltage generator for generating a voltage to be supplied to the nonvolatile memory cell. The voltage generator comprises: a clock signal controller for generating a first clock signal and a second clock signal having a frequency higher than that of the first clock signal and selecting and outputting one of the first and second clock signals, and a charge pump circuit for boosting a voltage by pumping operation using either the first clock signal or the second clock signal output from the clock signal controller, thereby generating a predetermined voltage. The clock signal controller outputs the first clock signal and then the second clock signal to the charge pump circuit, and the charge pump circuit performs boosting operation using a first clock signal output from the clock signal controller and, after that, boosting operation using a second clock signal, thereby generating a predetermined voltage to be supplied to the nonvolatile memory cell.

The outline of another invention of the application will be also briefly described.

In the semiconductor integrated circuit device according to the invention, the clock signal controller outputs the first clock signal for predetermined time and, after that, outputs the second clock signal.

In the semiconductor integrated circuit device according to the invention, in boosting operation of the charge pump circuit, the clock signal controller outputs the first clock signal until a voltage output from the charge pump circuit is boosted to an arbitrary voltage value and, after that, outputs the second clock signal until the predetermined voltage reaches a specific voltage value.

Effects obtained by the representative ones of the inventions disclosed in the application will be briefly described as follows.
(1) Since the current peak when the voltage generator operates can be reduced, the peak in consumption current in the semiconductor integrated circuit device can be suppressed.
(2) From (1), by constructing an IC card by using the semiconductor integrated circuit device of the invention, at the time of transmitting information via an information transmission medium such as electric waves, the communication distance of the IC card can be increased or the operation of the IC card can be stabilized.

BRIEF DESCRIPTION OF THE DRAWINGS

FIG. 11 is an operation timing chart in the components of an IC card examined by the inventors herein.

DETAILED DESCRIPTION OF THE PREFERRED EMBODIMENTS

Figure 1:
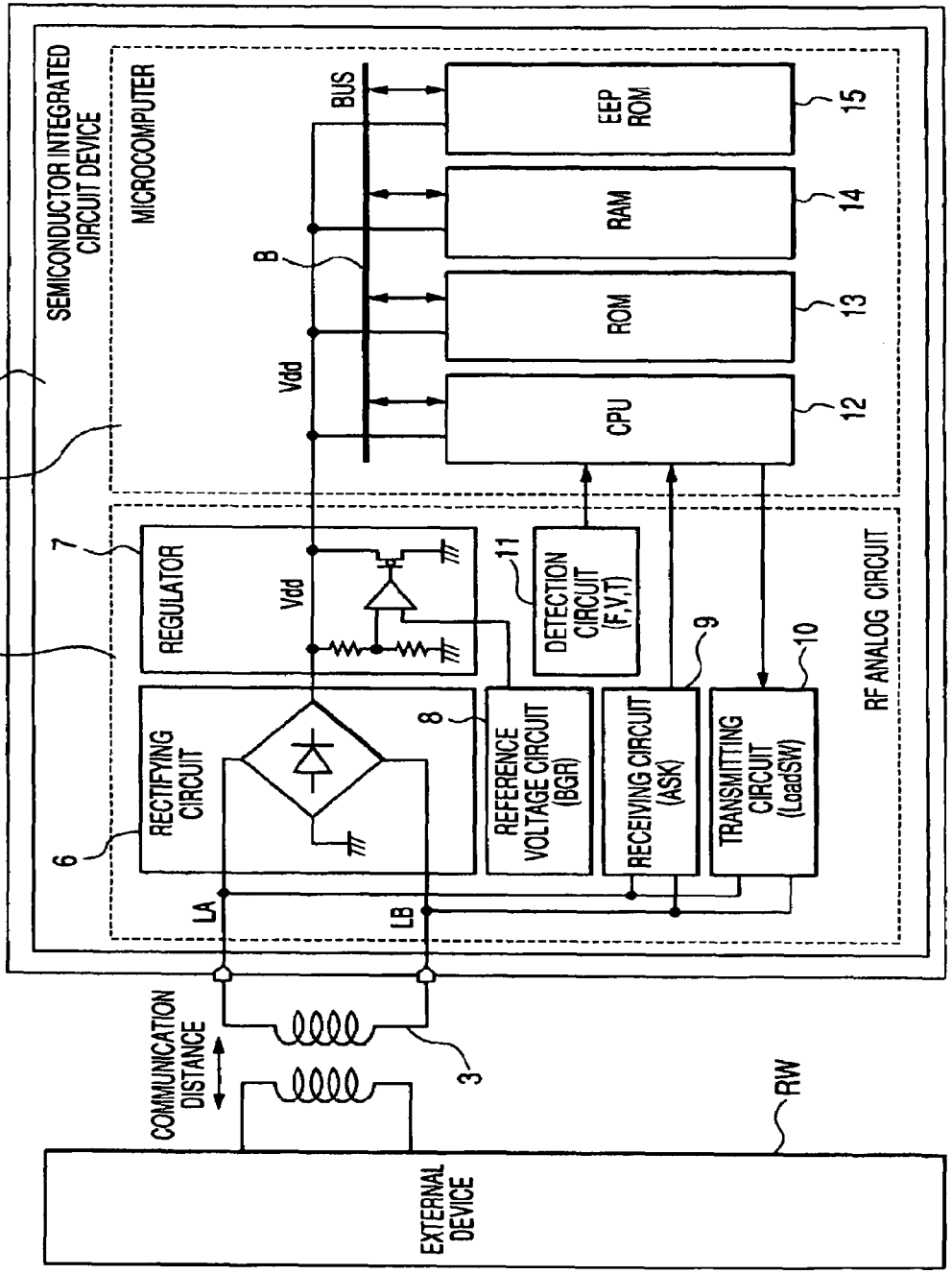
FIG. 1 is a block diagram of an IC card according to an embodiment of the invention.

Embodiments of the invention will be described in detail hereinbelow with reference to the drawings. In all of the drawings for explaining the embodiments, as a principle, the same reference numerals are designated to the same members and their repetitive description will not be given.

Figure 2:
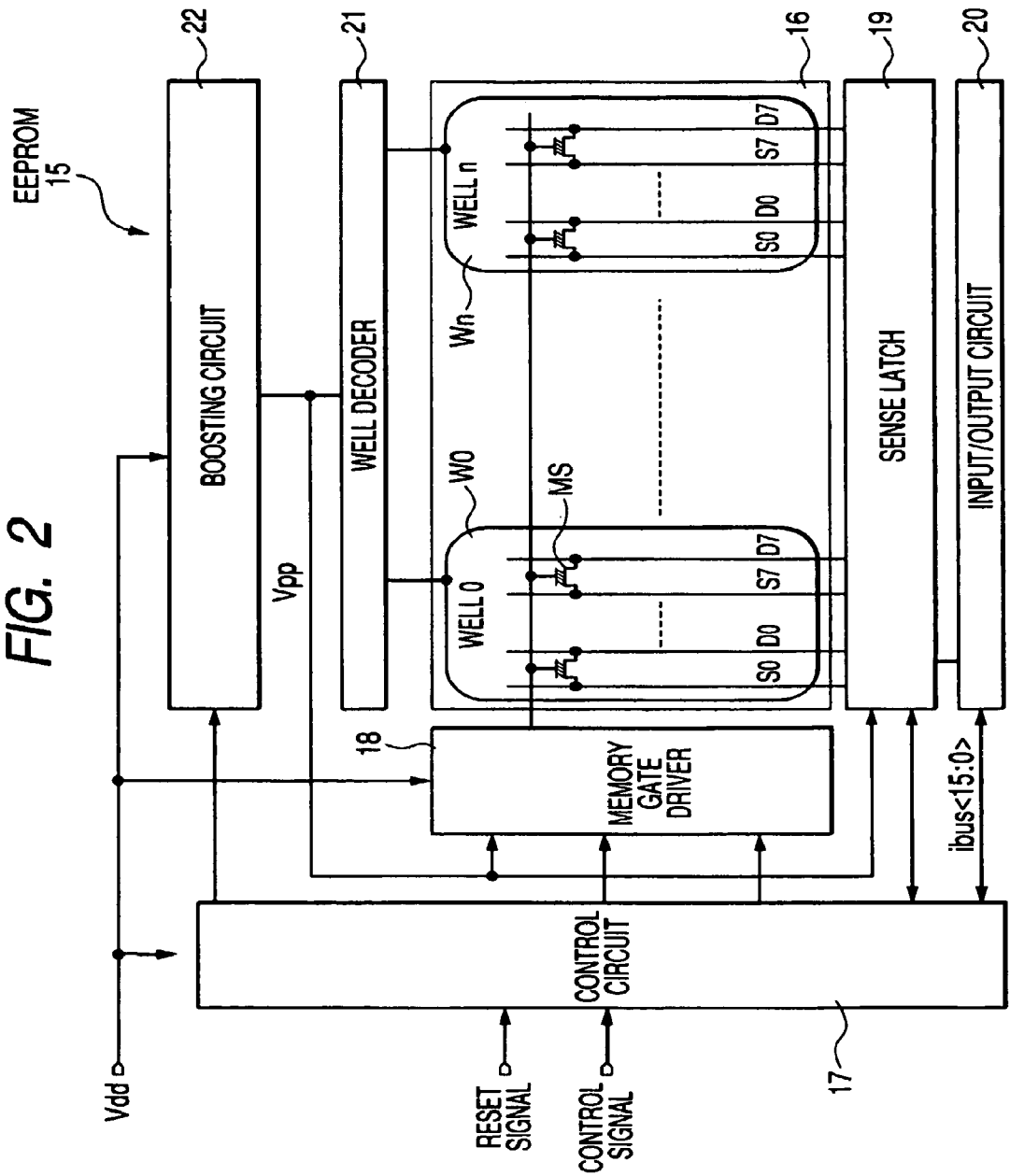
FIG. 2 is a block diagram showing a semiconductor integrated circuit device provided for the IC card in FIG. 1.
Figure 3A:
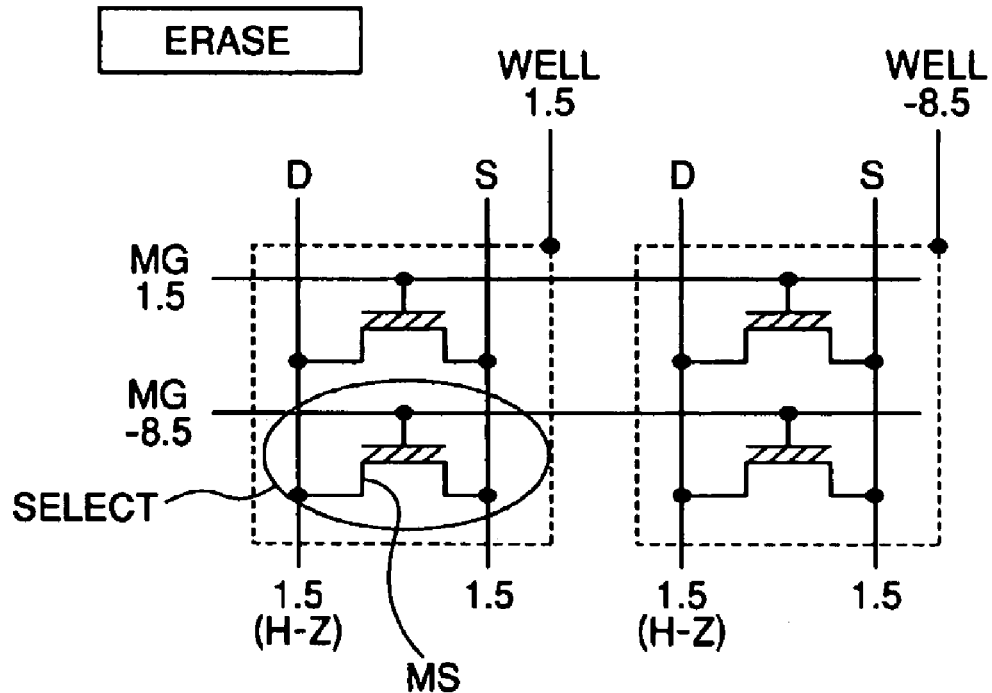
FIGS. 3A and 3B are diagrams illustrating the relations of voltages of components applied to memory cells at the erasure and write times in an EEPROM provided for the semiconductor integrated circuit device in FIG. 2.
Figure 3B:
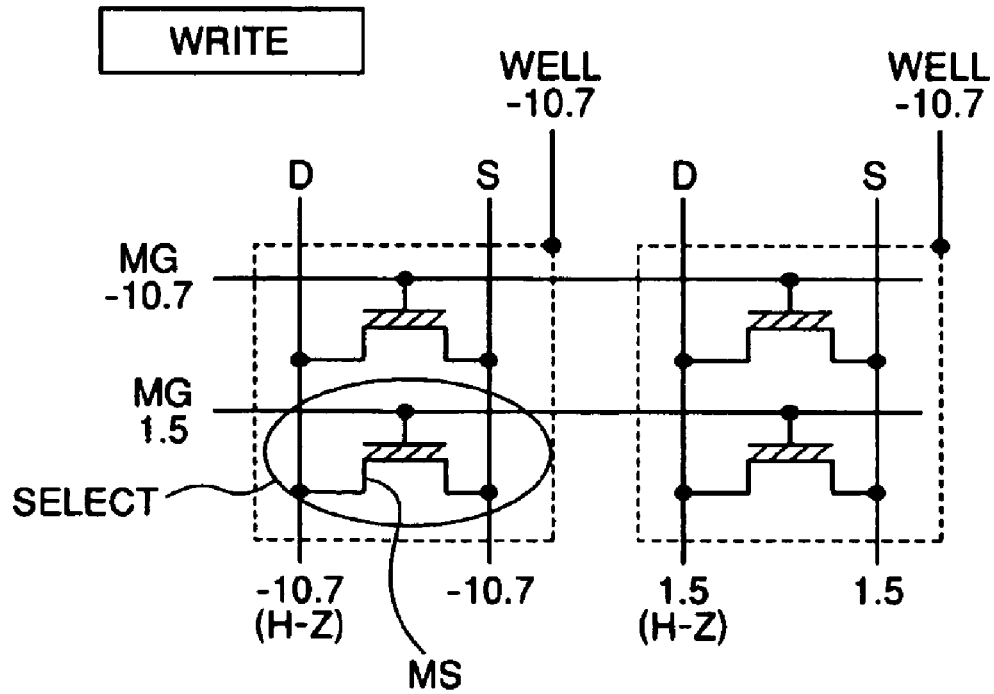
Figure 4:
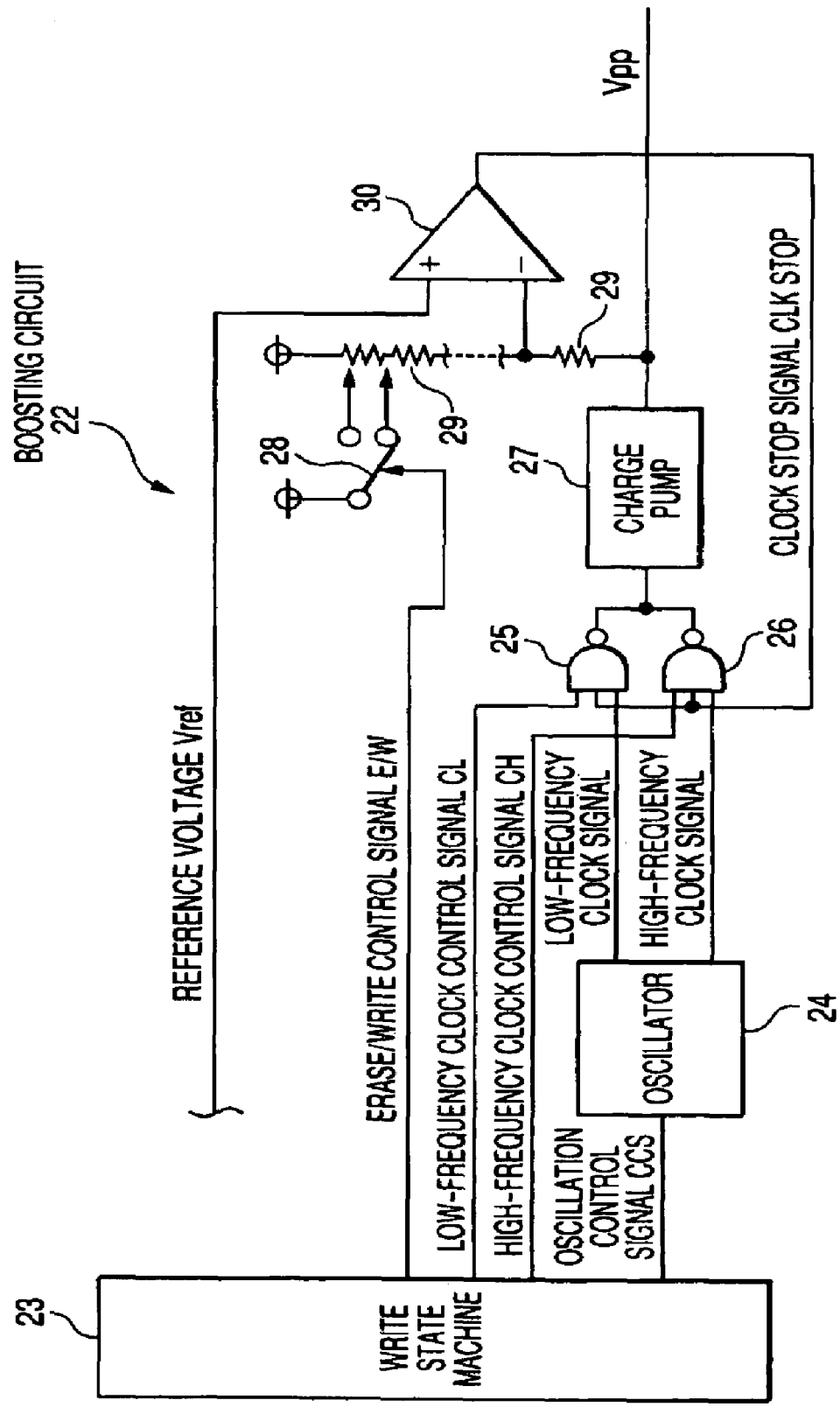
FIG. 4 is a block diagram showing an example of a boosting circuit provided for the EEPROM in FIG. 2.
Figure 5:
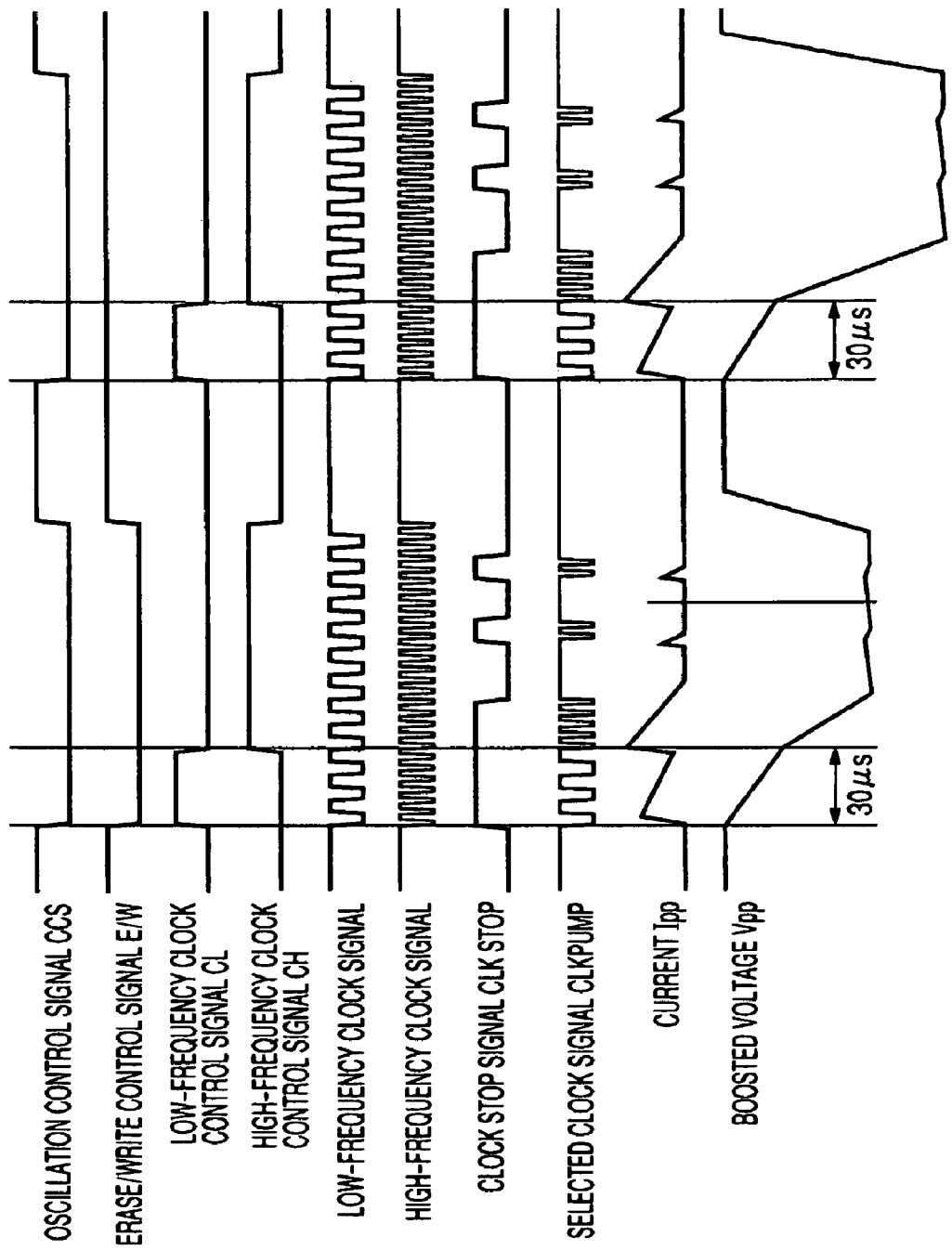
FIG. 5 is a timing chart showing operation waveforms of parts in the boosting circuit in FIG. 4.
Figure 6:
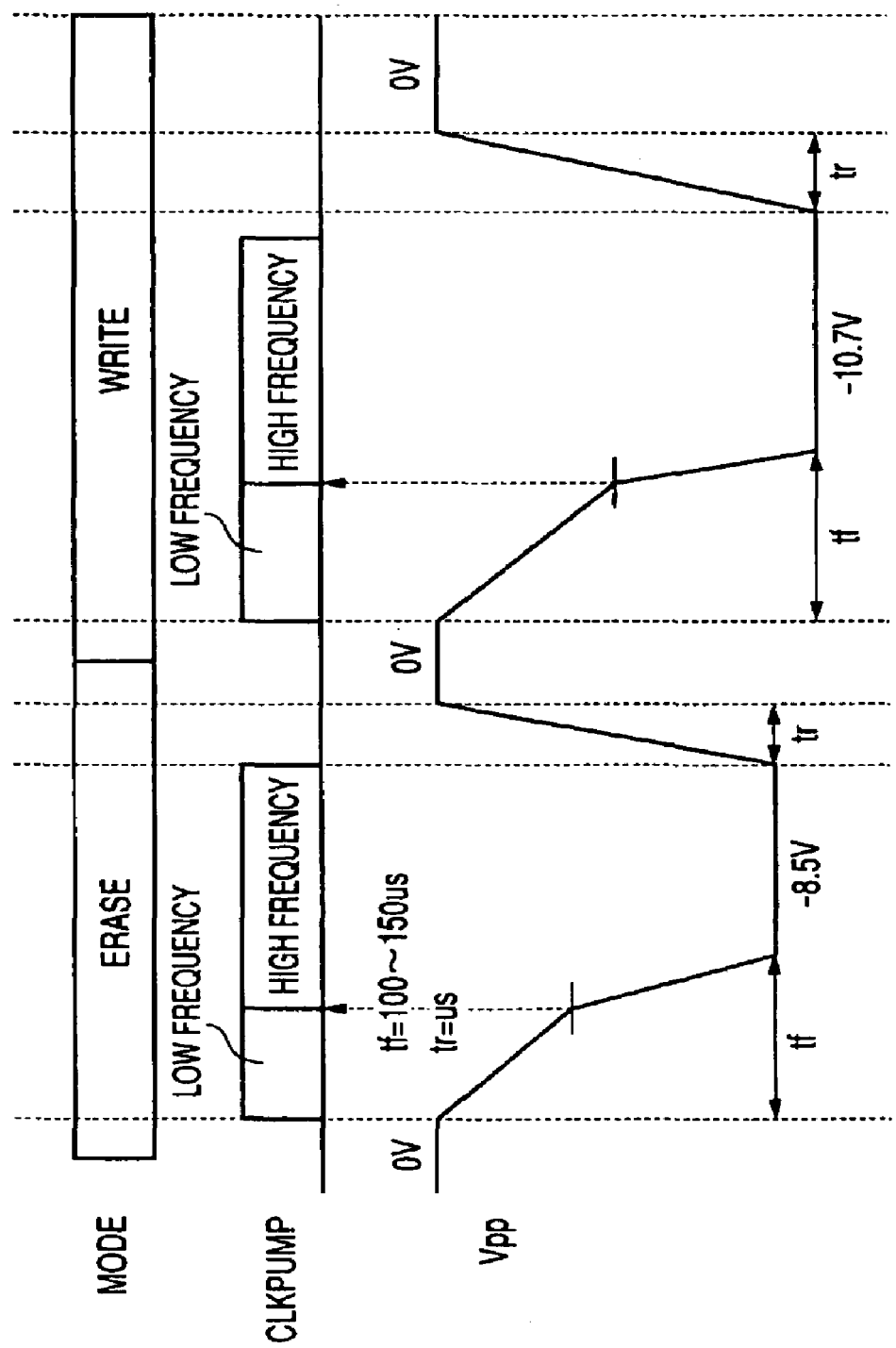
FIG. 6 is a diagram showing operation waveforms of a selection clock signal and boosted voltage at the time of erase/write operation in the voltage boosting circuit of FIG. 4.
Figure 7:
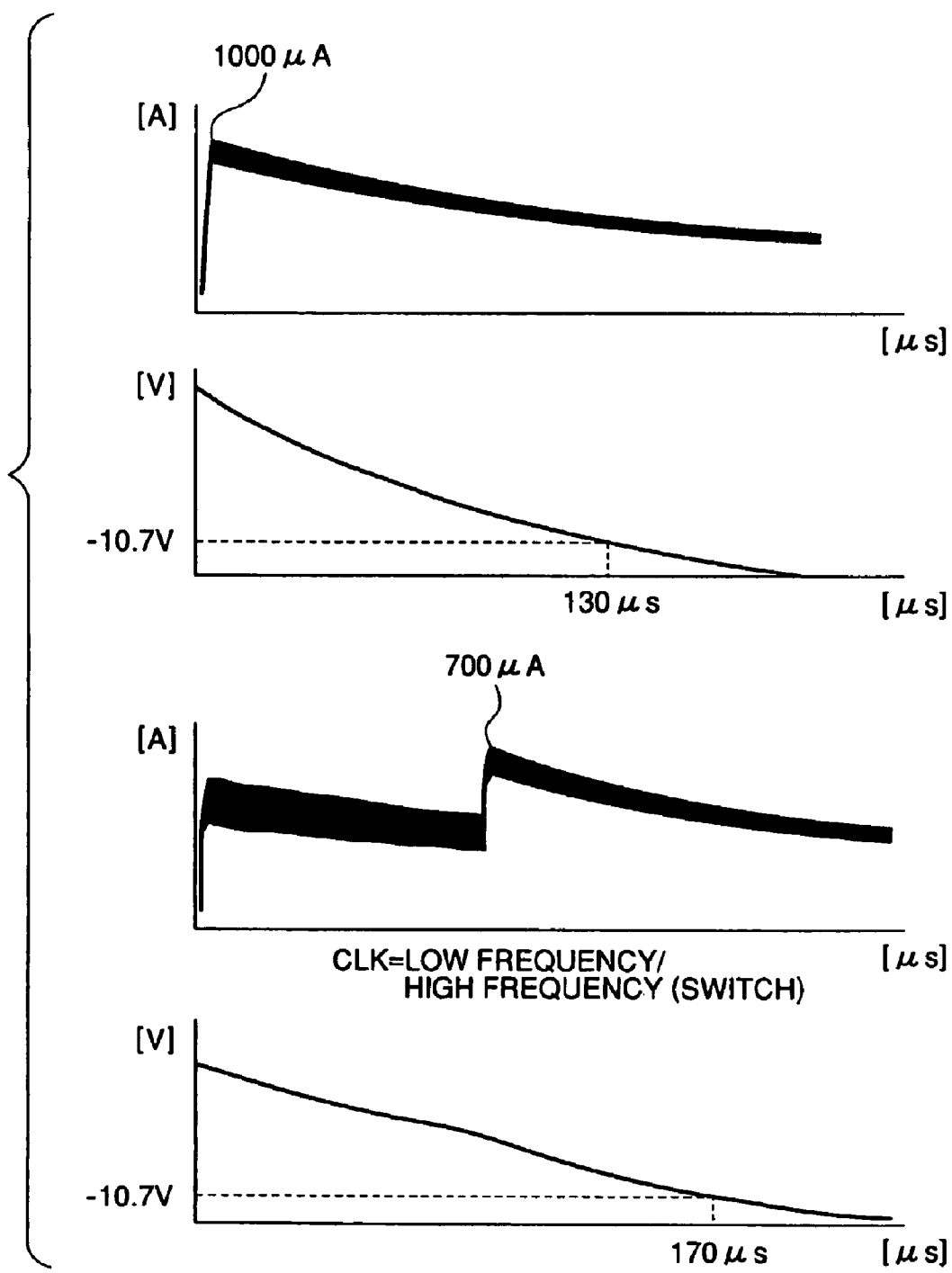
FIG. 7 is a simulation diagram showing the relation of boosted current/clock signal between a voltage boosting circuit using a high frequency clock signal examined by the inventors herein and a voltage boosting circuit of the invention.
Figure 8:
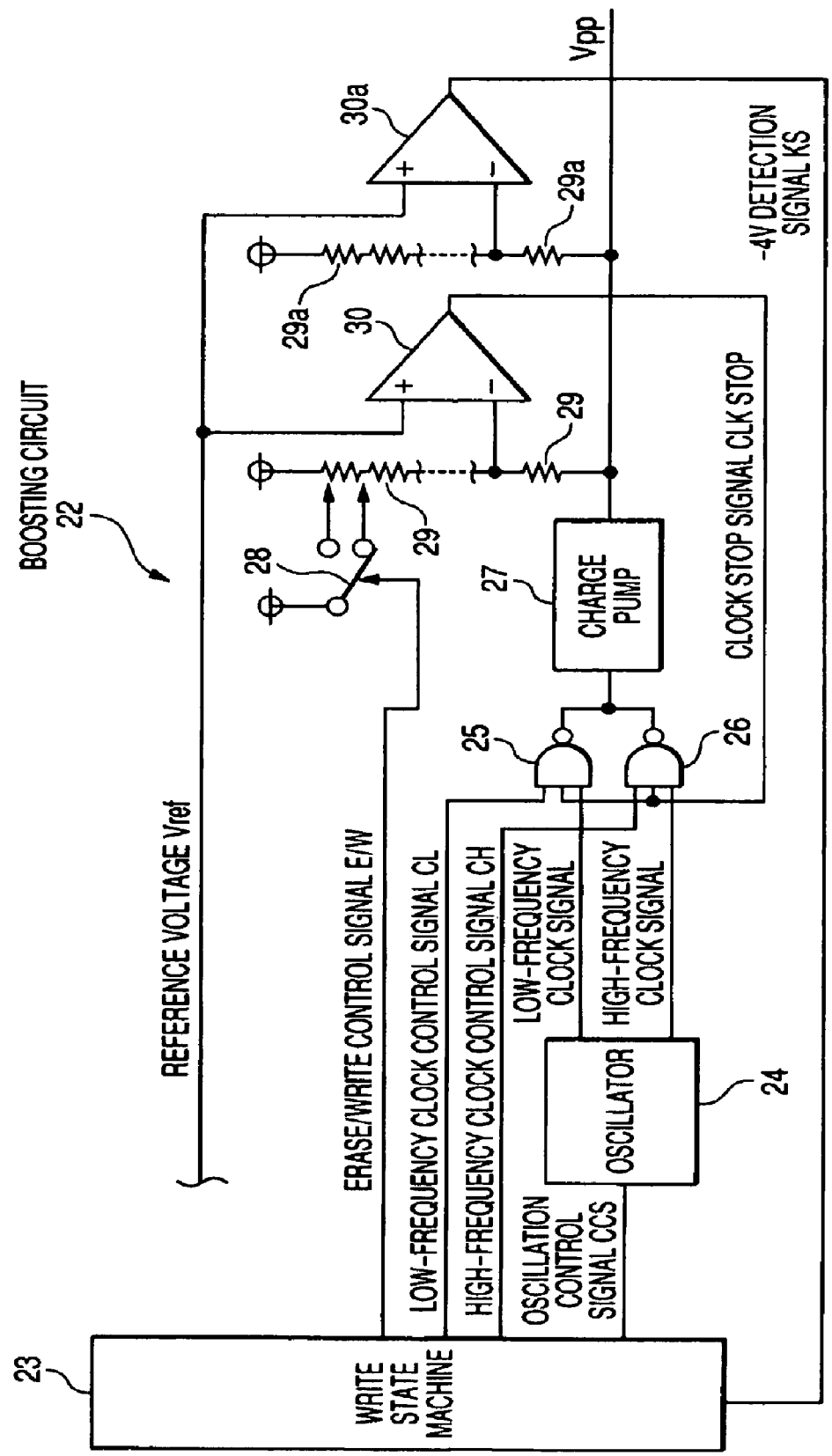
FIG. 8 is a block diagram showing another example of the boosting circuit provided for the EEPROM in FIG. 2.
Figure 9:
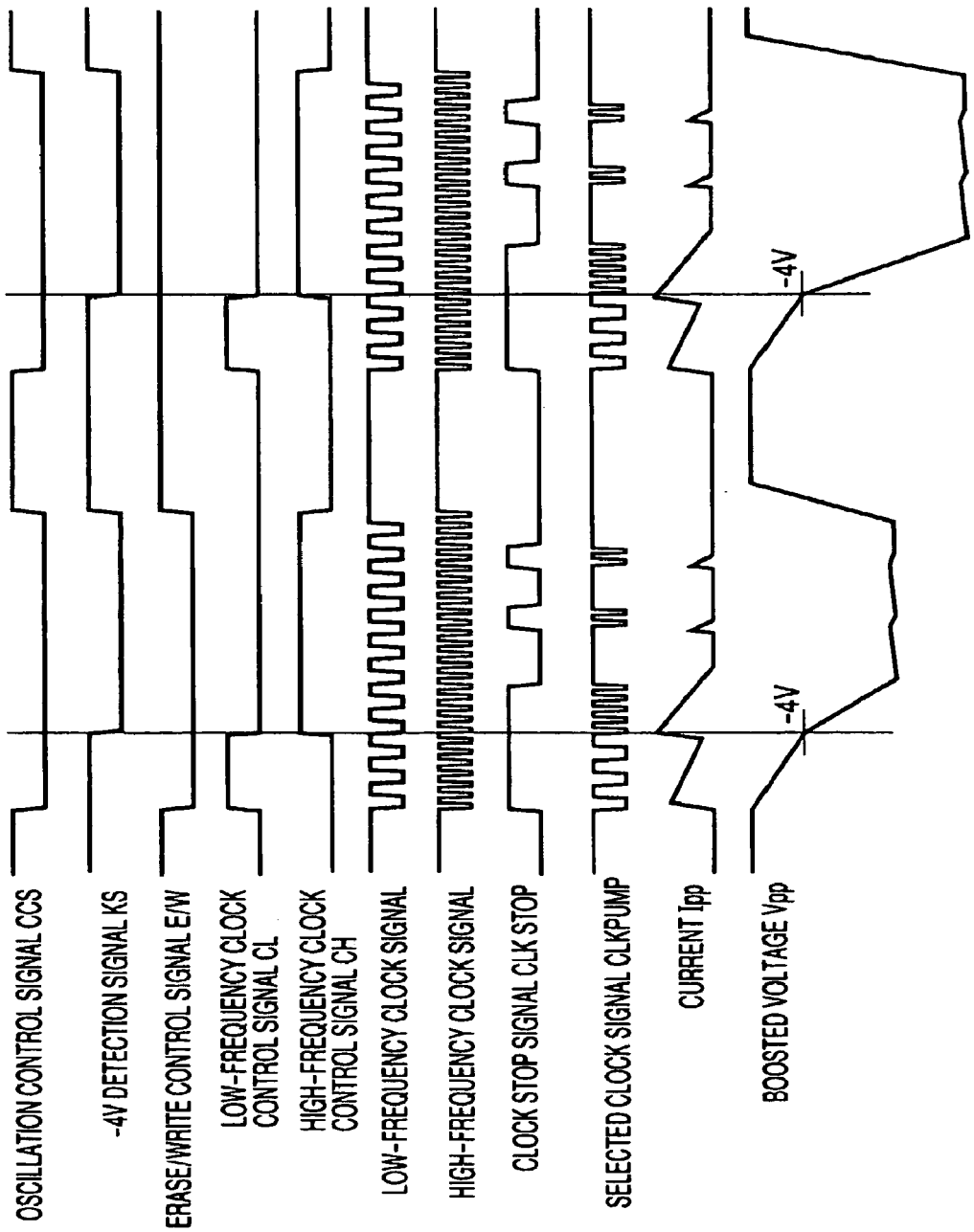
FIG. 9 is a timing chart showing operation waveforms of parts in the voltage boosting circuit in FIG. 8.

FIG. 1 is a block diagram of an IC card according to an embodiment of the invention. FIG. 2 is a block diagram showing a semiconductor integrated circuit device provided for the IC card in FIG. 1. FIGS. 3A and 3B are diagrams illustrating the relations of voltages of components applied to memory cells at the erasure and write times in an EEPROM provided for the semiconductor integrated circuit device in FIG. 2. FIG. 4 is a block diagram showing an example of a boosting circuit provided for the EEPROM in FIG. 2. FIG. 5 is a timing chart showing operation waveforms of parts in the boosting circuit in FIG. 4. FIG. 6 is a diagram showing operation waveforms of a selection clock signal and boosted voltage at the time of erase/write operation in the voltage boosting circuit of FIG. 4. FIG. 7 is a simulation diagram showing the relation of boosted current/clock signal between a voltage boosting circuit using a high frequency clock signal examined by the inventors herein and a voltage boosting circuit of the invention. FIG. 8 is a block diagram showing another example of the boosting circuit provided for the EEPROM in FIG. 2. FIG. 9 is a timing chart showing operation waveforms of parts in the voltage boosting circuit in FIG. 8.

In the embodiment, an IC card 1 is of a non-contact type for transmitting information by an information transmitting medium such as electric waves. The IC card 1 is obtained by embedding a semiconductor integrated circuit device 2 in a plastic card having a shape similar to that of a magnetic card.

To connection terminals LA and LB of the semiconductor integrated circuit device 2, as shown in FIG. 1, a coil 3 serving as an antenna buried near the peripheral portion of the plastic card is connected. When the IC card 1 operates, the coil 3 receives electric waves from a card terminal and performs power supply, information communication, and the like.

The semiconductor integrated circuit device 2 is constructed by, as shown in FIG. 1, an RF analog circuit 4 and a microcomputer 5. The RF analog circuit 4 is constructed by a rectifying circuit 6, a regulator 7, a reference voltage circuit 8, a receiving circuit 9, a transmitting circuit 10, and a detection circuit 11. The microcomputer 5 is constructed by a CPU 12, a ROM 13, a RAM (Random Access Memory) 14, and an EEPROM 15.

Both of the terminals of the coil 3 are connected to the rectifying circuit 6. The rectifying circuit 6 receives electric waves radiated from an external device RW such as a reader/writer. When current is flows in the coil 3 by electromagnetic induction, the rectifying circuit 6 rectifies the alternating current voltage generated across the terminals of the coil 3 and converts it to direct current voltage.

The rectifying circuit 6 is connected to the regulator 7. The regulator 7 stabilizes the direct current voltage rectified by the rectifying circuit 6, thereby generating the internal power source voltage Vdd. The reference voltage circuit 8 takes the form of a band gap circuit and generates a reference voltage Vref used for the regulator 7.

The receiving circuit 9 demodulates data of an ASK (Amplitude Shift Keying) signal obtained by changing the amplitude of a carrier wave received by the coil 3 in correspondence with an input digital signal and outputs the demodulated data to the CPU 12.

The transmitting circuit 10 performs ASK-modulation on data which is output from the CPU 12 and transmits the resultant data from the coil 3. The detection circuit 11 detects the frequency of the carrier wave, the voltage level of the internal power source voltage Vdd, the temperature in the IC card 1, and the like. When something abnormal happens, the transmitting circuit 10 outputs a reset signal to reset the CPU 12.

In the microcomputer 5, the CPU 12, ROM 13, RAM 14, and EEPROM 15 are connected to each other via an internal bus B. The CPU 12 performs all of controls in the IC card 1 on the basis of a program stored in the ROM 13.

The ROM 13 is a read only memory in which the control program of the IC card 1 and the like is stored. The RAM 14 is a volatile memory and temporarily stores data input/output to/from the IC card at the time of contact operation of the IC card 1.

The EEPROM 15 is an electrically erasable and programmable read only memory and stores an encryption key for encrypting communication with the external device RW, financial settlement information, and the like and stores data temporarily stored in the RAM 14.

FIG. 2 is a block diagram showing the configuration of the EEPROM 15.

The EEPROM 15 is constructed by a memory cell array 16, a control circuit 17, a memory gate driver 18, a sense latch 19, an input/output circuit 20, a well decoder 21, and a boosting circuit (voltage generator) 22.

The memory cell array 17 is constructed by a plurality of wells in each of which arbitrary bytes (for example, 128 bytes) of nonvolatile memory cells (nonvolatile memory cells) MS each for storing 2-bit data are arranged in matrix.

The control circuit 17 executes controls on the memory gate driver 18, sense latch 19, and boosting circuit 22 on the basis of a control signal output from the CPU 12, and inputs/outputs data via the input/output circuit 20.

The memory gate driver 18 selects an arbitrary word line on the basis of the control of the control circuit 17 and applies a necessary arbitrary voltage at the time of erase/write/read operation. The sense latch 19 amplifies and latches a source line read signal and a data line read signal under control of the control circuit 17.

The input/output circuit 20 has a buffer circuit for temporarily storing data input/output to/from the control circuit 17. The well decoder 21 selects an arbitrary well from a plurality of wells WO to Wn and supplies a well voltage to each of the memory cells MS formed in the selected well.

The boosting circuit 22 generates a boosted voltage as a negative high voltage (for example, about −8.5V, about −10.7, or the like) necessary for erasing/writing data from/to the memory cell MS.

FIGS. 3A and 3B are diagrams illustrating the relations of voltages of parts applied to the memory cell MS at erasure and write times.

At the time of erasure, as shown in FIG. 3A, 1.5V is applied to a selected well including a memory cell to be erased, about −8.5V is applied to the memory gate of the memory cell MS to be erased, about 1.5V is applied to the memory gate of a memory cell not to be erased, and about 1.5V (internal power source voltage Vdd) is applied to a source S (source line) and a drain D (data line). At this time, a well voltage of about −8.5V is applied to a not-selected well, and about 1.5V (internal power source voltage Vdd) is applied to the source S (source line) and the drain D (data line).

At the time of writing, as shown in FIG. 3B, about 1.5V (internal power source voltage Vdd) is applied to the memory gate of the memory cell MS to be written, about −10.7V is applied to the memory gate of the memory cell MS which is not to be written, and about −10.7V is applied to the source S (source line) and the drain D (data line) The well voltage of about −10.7V is applied to both of the selected well which includes the memory cell MS to be written and the unselected well.

By applying voltages as described above, at the time of erasure, charges are discharged from a charge accumulation area in the memory cell MS to the well so that the threshold voltage of the memory cell MS can be decreased. At the time of writing, charges are injected from the well of the memory cell MS to the charge accumulation area so that the threshold voltage of the memory cell MS can be increased. The relation between writing and erasure is determined by definitions of the threshold voltages of the memory cell and may be opposite to that in the description of FIG. 3. The discharge of charges from the charge accumulation layer and injection of charges to the charge accumulation layer may be performed not between wells but between memory gates.

FIG. 4 is a diagram illustrating an example of the configuration of the boosting circuit 22.

The boosting circuit 22 applies the erase voltage and write voltage of the memory cell MS in two voltage levels in the data writing operation of the EEPROM 15.

The boosting circuit 22 includes a write state machine (control circuit) 23, an oscillator (clock signal controller) 24, NAND circuits (clock signal controller and clock selector) 25 and 26, a charge pump (charge pump circuit) 27, a switch 28, plural resistors (clock stop detectors) 29, and a comparator (clock stop detector) 30.

The write state machine 23 controls the boost voltage boosted by the boosting circuit 22 on the basis of the control of the control circuit 17. The write state machine 23 outputs an erase/write control signal E/W, a low-frequency clock control signal CL, a high-frequency clock control signal CH, and an oscillation control signal CCS.

The oscillation control signal CCS is input to the oscillator 24 and, according to the oscillation control signal CCS, the oscillator 24 outputs a low-frequency clock signal (first clock signal) and a high-frequency signal (second clock signal) of a frequency higher than that of the low-frequency clock signal.

Each of the NAND circuits 25 and 26 has three input parts. The low-frequency clock control signal CL is connected to one of the input parts of the NAND circuit 25, and the low-frequency clock signal generated by the oscillator 24 is input to another input part of the NAND circuit 25.

To two input parts of the NAND circuit 26, the high-frequency clock control signal CH and the high-frequency clock signal generated by the oscillator 24 are input. To the remaining one input part of each of the NAND circuits 25 and 26, a comparison result output from the comparator 30 is input.

The output part of each of the NAND circuits 25 and 26 is connected to the input part of the charge pump 27. The charge pump 27 generates a boosted voltage (about −8.5V, about −10.7V, or the like) by charge pumping operation by using the low-frequency clock signal or high-frequency clock signal supplied via the NAND circuits 25 and 26.

The plurality of resistors 29 are connected in series. One of connection parts and the other connection part of the switch 28 are connected to arbitrary connection parts of the resistors 29. The internal power source voltage Vdd is applied to the common connection part of the switch 28.

The switch 28 switches the output destination of the internal power source voltage Vdd between the erasing operation and the writing operation on the basis of an erase/write control signal E/W output from the write state machine 23. The erase/write control signal E/W becomes, for example, the low level in the erasing operation and becomes the high level in the writing operation.

To one of the final terminal of the resistors 29 connected in series, the output part of the charge pump 27 is connected. To an arbitrary connection part of the resistors 29 connected in series, the negative (−) side input terminal of the comparator 30 is connected.

To the positive (+) side input terminal of the comparator 30, a reference voltage Vref generated by the reference voltage circuit 8 is input. The comparator 30 compares a comparison voltage divided by the plurality of resistors 29 with the reference voltage Vref and outputs a clock stop signal CLK-STOP on the basis of the comparison result.

The operation of the boosting circuit 22 in the embodiment will now be described.

FIG. 5 is a timing chart showing operation waveforms of parts in the boosting circuit 22.

FIG. 5 shows waveform timings of, from top to bottom, the oscillation control signal CCS output from the write state machine 23, the erase/write control signal E/W output from the write state machine 23, the low-frequency clock control signal CL and the high-frequency clock control signal CH output from the write state machine 23, the low-frequency clock signal and the high-frequency clock signal output from the oscillator 24, the clock stop signal CLKSTOP output from the comparator 30, the selection clock signal CLKPUMP input to the charge pump 27, consumed current Ipp of the boosting circuit 22, and the boosted voltage Vpp output from the boosting circuit 22.

First, in the erasing operation, the low-level oscillation control signal CCS, low-level erase/write control signal E/W, high-level low-frequency clock control signal CL, and the low-level high-frequency clock signal are output from the write state machine 23.

The oscillator 24 receives the low-level oscillation control signal CCS, starts generating the low-frequency clock and the high-frequency clock, and outputs the generated signals. The switch 28 performs predetermined switching on the basis of the low-level erase/write control signal E/W and switches the destination of the internal power source voltage Vdd so as to generate the comparison voltage at the time of the erasing operation.

The high-level low-frequency clock control signal CL is input to the NAND circuit 25 and the low-level high-frequency clock control signal CH is input to the NAND circuit 26. Consequently, output of the high-frequency clock signal is stopped and only the low-frequency clock signal is input as a selection clock signal CLKPUMP to the input part of the charge pump 27.

The charge pump 27 receives the selection clock signal CLKPUMP of the low-frequency clock signal and starts the boosting operation. Since the charge pump 27 charges an electrostatic capacitor, consumption current becomes the peak immediately after the operation and, as charging advances, the consumption current decreases.

After lapse of a certain period (for example, about 30 μs after the high-level low-frequency clock control signal CL is output), the write state machine 23 makes the low-frequency clock control signal CL shifted to the low level and makes the high-frequency clock control signal CH shifted from the low level to the high level.

Consequently, outputting of the low-frequency clock signal stops and the high-frequency clock signal is input as the selection clock signal CLKPUMP to the input part of the charge pump 27. Immediately after start of the boosting operation in response to the high-frequency clock signal, the consumption current of the charge pump 27 becomes the peak again and then gradually decreases.

When the boosted voltage Vpp output from the charge pump 27 increases to about −8.5V as the erase voltage, the comparator 30 outputs the low-level clock stop signal CLK-STOP.

The NAND circuits 25 and 26 receive the low-level clock stop signal CLKSTOP and stop outputting the clock signal, so that the operation of the charge pump 27 stops. When the boosted voltage Vpp decreases, the comparator 30 outputs again the high-level clock stop signal CLKSTOP and performs control to operate the charge pump 27 to hold the boosted voltage Vpp at a predetermined voltage level.

After completion of the memory cell erasing operation, to switch the destination of the boosted voltage Vpp output from the charge pump 27, the operation of the charge pump 27 is temporarily stopped. After that, for the writing operation, the charge pump 27 starts operating again.

In the writing operation, the operation of the charge pump 27 is similar to that in the above-described erasing operation. The different point is that the boosted voltage Vpp generated by the charge pump 27 is about −10.7V.

In this case as well, the charge pump 27 receives the low-frequency clock signal as the selection clock signal CLK-PUMP and starts the boosting operation. After lapse of a certain period (about 30 μs after the high-level low-frequency clock control signal CL is output), the high-frequency clock signal is input as the selection clock signal CLKPUMP to the input part of the charge pump 27 by the control of the write state machine 23.

Therefore, in the charge pump 27, the consumption current peak appears twice; once immediately after the low-frequency clock signal is input and once immediately after the high-frequency clock signal is input.

FIG. 6 is a diagram showing operation waveforms of the selection clock signal CLKPUMP and the boosted voltage Vpp in the erasing operation and the writing operation in the boosting circuit 22.

In the erasing or writing operation, first, the low-frequency clock signal as the selection clock signal CLKPUMP is input to the charge pump 27. Although the peak of the consumption current can be made smaller by generating the boosted voltage Vpp only by the low-frequency clock signal, a fall time tf of the boosted voltage Vpp increases.

Therefore, after lapse of a certain period (about ⅓ of the fall time tf), a high-frequency clock signal of a frequency higher than that of the low-frequency clock signal is selected and input as the selection clock signal CLKPUMP to the charge pump 27 to perform the boosting operation, thereby shortening the time to obtain the final voltage of the boosted voltage as compared with the case of generating the boosted voltage only by the low-frequency clock signal. In such a manner, the fall time tf of the boosted voltage Vpp can be shortened while suppressing the peak of the consumption current of the charge pump 27.

FIG. 7 is a simulation diagram showing the relation of the consumption current and the clock signal.

The upper part of FIG. 7 shows the relation of the consumption current of the boosting circuit 22 for generating a boosted voltage only by the high-frequency clock signal examined by the inventors herein and the clock signal. The lower part shows the relation of the consumption current of the boosting circuit 22 for generating a boosted voltage by switching between the high-frequency clock signal and the low-frequency clock signal in the present invention and the clock signal.

As shown in the diagram, in the case of boosting the voltage only by the high-frequency clock signal, it takes 130 μs for the boosted voltage to reach −10.7V, which is shorter than the required time 170 As of the boosting circuit 22.

On the other hand, the peak of the consumption current is about 1,000 μA in the case where the voltage is boosted only by the high-frequency clock signal, which is much larger than about 700 μA as the peak of the consumption current of the boosting circuit 22.

As described above, the fall time can be prevented from becoming much longer while largely suppressing the peak consumption current by the boosting circuit 22 for boosting the voltage by the low-frequency/high-frequency clock signals.

FIG. B is a diagram showing another example of the configuration of the boosting circuit 22.

In the boosting circuit 22, a clock signal input to the charge pump 27 is switched according to the voltage value of the boosted voltage. In this case, for example, when the boosted voltage becomes about −4V, the low-frequency clock signal is switched to the high-frequency clock signal.

The boosting circuit 22 is obtained by adding a comparator (voltage detector) 30a and a plurality of resistors (voltage detectors) 29a to the configuration including the write state machine 23, oscillator 24, NAND circuits 25 and 26, charge pump 27, switch 28, plural resistors 29, and comparator 30.

The plurality of resistors 29a are connected in series between the internal power source voltage Vdd and the boosted voltage Vpp generated by the charge pump 27. A reference voltage Vref generated by the reference voltage circuit 8 is input to the positive (+) side input terminal of the comparator 30a, an arbitrary connection part in the resistors 29a connected in series is connected to the negative (−) side input terminal of the comparator 30 so as to input a voltage divided by the resistors 29a.

A −4V detection signal KS output from the output part of the comparator 30a is input to the write state machine 23. The comparator 30a compares the reference voltage Vref with the voltage divided by the resistors 29a and, when the boosted voltage Vpp output from the charge pump 27 becomes about −4V, outputs the −4V detection signal KS. Since the other connection configuration is similar to that of FIG. 4, the description will not be repeated.

FIG. 9 is a timing chart showing operation waveforms of parts in the boosting circuit 22 of FIG. 8.

FIG. 9 shows waveform timings of, from top to bottom, the oscillation control signal CCS, −4V detection signal KS output from the comparator 30a, erase/write control signal E/W, low-frequency clock control signal CL, high-frequency clock control signal CH, the low-frequency clock signal, the high-frequency clock signal, clock stop signal CLKSTOP, selection clock signal CLKPUMP, consumed current Ipp, and boosted voltage Vpp.

First, in the erasing operation, the low-level oscillation control signal CCS, low-level erase/write control signal E/W, high-level low-frequency clock control signal CL, and the low-level high-frequency clock signal are output from the write state machine 23.

The oscillator 24 receives the low-level oscillation control signal CCS, generates the low-frequency clock and the high-frequency clock, and outputs the generated signals. The switch 28 performs predetermined switching on the basis of the low-level erase/write control signal E/W and switches the destination of the internal power source voltage Vdd so as to generate the comparison voltage at the time of the erasing operation.

The high-level low-frequency clock control signal CL is input to the NAND circuit 25 and the low-level high-frequency clock control signal CH is input to the NAND circuit 26. Consequently, outputting of the high-frequency clock signal is stopped and only the low-frequency clock signal is input as a selection clock signal CLKPUMP to the input part of the charge pump 27.

The charge pump 27 receives the low-frequency clock signal as the selection clock signal CLKPUMP and starts the boosting operation. The current Ipp becomes the peak immediately after start of operation of charging an electrostatic capacitor and, as charging advances, the current decreases.

After that, when the boosted voltage Vpp becomes about −4V, the comparator 30a outputs the low-level −4V detection signal KS to the write state machine 23. The write state machine 23 receives the low-level −4V detection signal KS, makes the low-frequency clock control signal CL shifted to the low level and makes the high-frequency clock control signal CH shifted from the low level to the high level.

Consequently, outputting of the low-frequency clock signal stops and the high-frequency clock signal is input as the selection clock signal CLKPUMP to the input part of the charge pump 27. The charge pump 27 starts boosting operation in response to the high-frequency clock signal. Immediately after start of the boosting operation in response to the high-frequency clock signal, the peak current flows and, after that, the consumption current gradually decreases.

When the boosted voltage Vpp output from the charge pump 27 increases to about −8.5V as the erase voltage, the comparator 30 outputs the low-level clock stop signal CLKSTOP.

The NAND circuits 25 and 26 receive the low-level clock stop signal CLKSTOP and stop outputting the clock signal, so that the operation of the charge pump 27 stops. When the boosted voltage Vpp decreases, the comparator 30 outputs again the high-level clock stop signal CLKSTOP and performs control to operate the charge pump 27 to hold the boosted voltage Vpp at a predetermined voltage level.

The writing operation is similar to the above-described erasing operation except for the point that the boosted voltage Vpp generated by the charge pump 27 is about −10.7V.

In this case as well, the charge pump 27 receives the low-frequency clock signal as the selection clock signal CLKPUMP and starts the boosting operation. After that, when the boosted voltage Vpp becomes about −4V, the −4V detection signal KS is output from the comparator 30a. By the control of the write state machine 23 receiving the −4V detection signal KS, the high-frequency clock signal is input as the selection clock signal CLKPUMP to the input part of the charge pump 27.

Therefore, the fall time of the boosted voltage Vpp can be shortened while suppressing the peak of the consumption current.

Thus, according to the embodiment, since the current peak can be largely suppressed at the time of operation of the boosting circuit 22, communications of the IC card 1 can be stabilized and the communication distance of the IC card 1 can be increased.

Although the IC card 1 of the non-contact type has 26 been described in the embodiment, an IC card 1a may be, for example, a so-called dual-type IC card of a contact/non-contact type.

Figure 10:
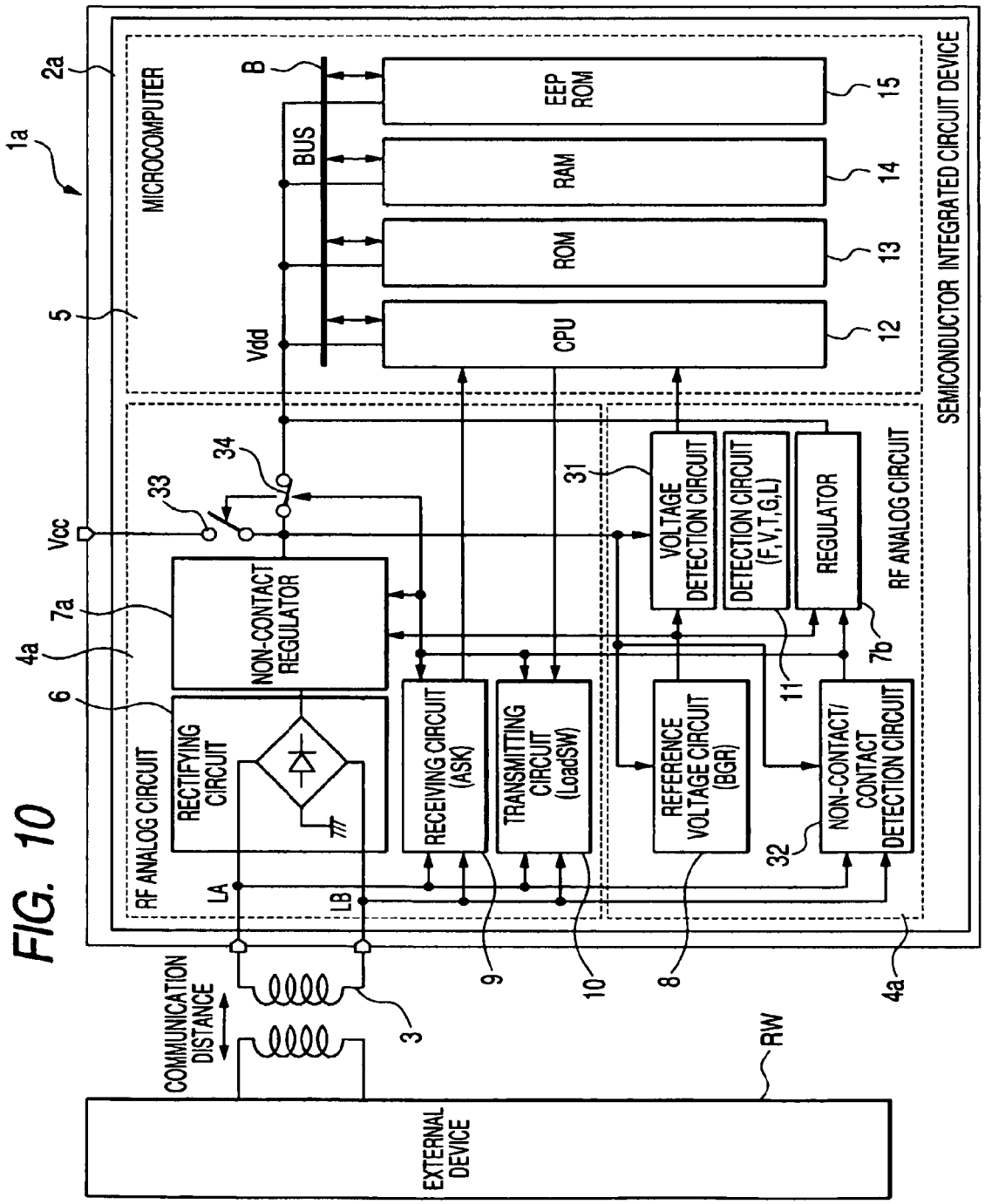
FIG. 10 is a block diagram of an IC card according to another embodiment of the invention.

FIG. 10 is a diagram showing the configuration of the IC card 1a of the dual type.

The IC card 1a is obtained by embedding a semiconductor integrated circuit device 2a in a plastic card having a shape similar to that of a magnetic card. The coil 3 serving as an antenna is buried near the peripheral portion of the plastic card. Both of the terminals of the coil 3 are connected to the connection terminals LA and LB (FIG. 2) of the semiconductor integrated circuit device 2.

At the time of a non-contact operation of the IC card 1, the coil 3 receives electric waves from a card terminal and performs power supply, information communication, and the like. In the surface of the plastic card, a plurality of external terminals of the semiconductor integrated circuit device 3 are exposed.

As external terminals, a clock terminal to which an external clock signal is supplied, a power source voltage terminal to which a power source voltage VCC is supplied, a reset terminal to which a reset signal is input, a ground terminal to which the reference potential VSS is connected, two input/output terminals to/from which data is input/output, and the like are provided. The external terminals are mechanically connected to external terminals of a card terminal at the time of contact operation of the IC card 1*a* to perform power supply, information communication, and the like.

The semiconductor integrated circuit device 2 is constructed by an RF analog circuit 4*a* and the microcomputer 5. The RF analog circuit 4*a* is constructed by the rectifying circuit 6, a non-contact regulators 7*a*, a regulator 7*b*, the reference voltage circuit 8, the receiving circuit 9, the transmitting circuit 10, the detection circuit 11, a voltage detection circuit 31, a contact/non-contact detection circuit 32, and change-over switches 33 and 34. The microcomputer 5 is constructed by the CPU 12, ROM 13, RAM 14, and EEPROM 15.

Both terminals of the coil 3 are connected to the rectifying circuit 6. The rectifying circuit 6 receives electric waves radiated from an external device RW such as a reader/writer. When current flows in the coil 3 by electromagnetic induction, the rectifying circuit 6 rectifies the alternating voltage generated across the terminals of the coil 3 and converts it to direct current voltage.

The rectifying circuit 6 is connected to the non-contact regulator 7*a*. The regulator 7*a* stabilizes the direct current voltage rectified by the rectifying circuit 6, thereby generating the internal power source voltage Vdd. When the IC card 1*a* performs contact operation, the regulator 7*b* generates the internal power source voltage Vdd from the power source voltage VCC supplied from the power source voltage terminal.

The reference voltage circuit 8 takes the form of a band gap circuit or the like, generates the reference voltage Vref from the internal power source voltage Vdd and supplies it to each of the non-contact regulator 7*a*, regulator 7*b*, and voltage detection circuit 31.

The receiving circuit 9 demodulates data of an ASK signal obtained by changing the amplitude of a carrier wave received by the coil 3 in correspondence with an input digital signal and outputs the demodulated data to the RAM 14. The transmitting circuit 10 performs ASK-modulation on data which is output from the RAM 14 and transmits the resultant data from the coil 3.

The detection circuit 11 detects the frequency of the carrier wave, the voltage level of the internal power source voltage Vdd, the temperature in the IC card 1*a*, glitch in the power source voltage VCC supplied via the power source voltage terminal, light, and the like. When something abnormal happens, the detection circuit 11 outputs a reset signal to the CPU 12.

The contact/non-contact detection circuit 32 determines the contact operation or non-contact operation by detecting whether voltage is supplied to the coil 3 or not at the time of operation of the IC card 1*a*, controls the non-contact regulator 7*a*, regulator 7*b*, receiving circuit 9, transmitting circuit 10, and the like and, when the IC card 1*a* performs the non-contact operation, switches the change-over switches 33 and 34 so as to electrically disconnect the power source voltage terminal.

The voltage detection circuit 31 determines the voltage level of the power source voltage VCC supplied via the power source voltage terminal and, when the voltage level reaches a certain level, outputs a reset signal to the CPU 12.

In the microcomputer 5, the CPU 12, ROM 13, RAM 14, and EEPROM 15 are connected to each other via the internal bus B. The CPU 12 performs all of controls in the IC card 1*a* on the basis of a program stored in the ROM 13. The ROM 13 is a read only memory in which the control program of the IC card 1*a* and the like is stored.

The RAM 14 is a volatile memory and temporarily stores data input/output to/from the IC card 1*a* at the time of contact operation of the IC card 1*a*. The EEPROM 15 is an electrically erasable and programmable read only memory and stores data temporarily stored in the RAM 14.

Also in the IC card 1*a*, the EEPROM 15 has the boosting circuit 22 shown in FIG. 4 or 8.

With the configuration, when the IC card 1*a* operates in a non-contact manner, the current peak in the operation of the boosting circuit 22 can be largely reduced, so that communication of the IC card 1*a* can be stabilized and longer communication distance of the IC card 1*a* can be realized.

Although the invention achieved by the inventors herein has been concretely described on the basis of the embodiment, obviously, the invention is not limited to the foregoing embodiment but can be variously modified without departing from the gist.

For example, as a component of the semiconductor integrated circuit device 2*a* (FIG. 10), in place of the ROM 13, a nonvolatile memory different from the EEPROM 15 may be provided. In this case, control similar to that of the boosting circuit of the invention can be performed for the another nonvolatile memory.

Further, not only the semiconductor integrated circuit device 2*a* but also another semiconductor integrated circuit device may be buried in the plastic card. Alternately, the semiconductor integrated circuit device 2*a* and another semiconductor integrated circuit device may be sealed in a package. The another semiconductor integrated circuit device may be another nonvolatile memory.

The semiconductor integrated circuit device of the invention is suitable for a technique of suppressing the current peak in a boosting circuit using a pumping circuit.

What is claimed is:

1. A data processing circuit used for a contactless IC card, comprising:
   a nonvolatile memory having a voltage generating circuit;
   a voltage generator;
   a clock generator; and
   a control circuit for instructing a data writing operation to the nonvolatile memory,
   wherein the nonvolatile memory performs data writing in response to a programmed instruction output from the control circuit based on a voltage generated by the voltage generator,
   wherein the voltage generator generates the voltage in response to a programmed instruction output from the control circuit based on a clock signal generated by the clock generator, and
   wherein the clock generator generates the clock signal in response to a programmed instruction output from the control circuit, wherein a frequency of the clock signal changes from a low frequency to a high frequency until said voltage reaches a predetermined voltage level.

2. A data processing circuit used for a contactless IC card according to claim 1,
wherein a boosting ratio of the voltage generated by the voltage generator is a first value during receiving the low frequency clock signal from the clock generator, and
wherein the boosting ratio of the voltage generated by the voltage generator is a second value during receiving the high frequency clock signal from the clock generator, said second value being higher than said first value.

3. A data processing circuit used for a contactless IC card according to claim 2,
wherein the clock generator changes the frequency of the clock signal after a predetermined time from starting to generate the voltage has elapsed.

4. A data processing circuit used for a contactless IC card according to claim 3, further comprising:
a radio frequency circuit for obtaining an operational voltage via electromagnetic waves.

5. A data processing circuit used for a contactless IC card according to claim 3,
wherein the voltage generator stops generating the voltage after a predetermined period has elapsed after the voltage reaches the predetermined voltage level.

6. A data processing circuit used for a contactless IC card according to claim 5,
wherein the voltage generator generates an erase voltage for a first predetermined generating period and a program voltage for a second predetermined generating period after generating the erase voltage, and
wherein each said generating period includes a low boosting ratio period associated with the low frequency clock signal and a high boosting ratio period associated with the high frequency clock signal.

* * * * *